United States Patent
Lin et al.

(10) Patent No.: US 9,696,634 B2
(45) Date of Patent: *Jul. 4, 2017

(54) IMMERSION LITHOGRAPHY SYSTEM USING A SEALED WAFER BATH

(71) Applicant: Taiwan Semiconductor Manufacturing Company, Ltd, Hsin-Chu (TW)

(72) Inventors: Burn Jeng Lin, HsinChu (TW); Ching-Yu Chang, Yuansun village (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/727,278

(22) Filed: Jun. 1, 2015

(65) Prior Publication Data
US 2015/0261103 A1    Sep. 17, 2015

Related U.S. Application Data

(63) Continuation of application No. 13/595,734, filed on Aug. 27, 2012, now Pat. No. 9,046,789, which is a
(Continued)

(51) Int. Cl.
*G03B 27/42* (2006.01)
*G03F 7/20* (2006.01)

(52) U.S. Cl.
CPC ................. *G03F 7/70341* (2013.01)

(58) Field of Classification Search
CPC .. G03F 7/70341; G03F 7/70716; G03F 7/707; G03F 7/2041; G03F 9/7026; G03F 9/70; G03F 9/7096; G03B 27/26
See application file for complete search history.

(56) References Cited

U.S. PATENT DOCUMENTS

| 5,610,683 A | 3/1997 | Takahashi |
| 6,788,477 B2 | 9/2004 | Lin |

(Continued)

FOREIGN PATENT DOCUMENTS

| CN | 1490673 | 4/2004 |
| CN | 1501175 | 6/2004 |

(Continued)

OTHER PUBLICATIONS

Japanese Patent Office, Office Action dated Jan. 4, 2011, Applicaiton No. 2007-245245, 5 pages.
(Continued)

*Primary Examiner* — Mesfin Asfaw
(74) *Attorney, Agent, or Firm* — Haynes and Boone, LLP

(57) ABSTRACT

Immersion lithography system and method using a sealed wafer bottom are described. One embodiment is an immersion lithography apparatus comprising a lens assembly comprising an imaging lens and a wafer stage for retaining a wafer beneath the lens assembly, the wafer stage comprising a seal ring disposed on a seal ring frame along a top edge of the wafer retained on the wafer stage, the seal ring for sealing a gap between an edge of the wafer and the wafer stage. The embodiment further includes a fluid tank for retaining immersion fluid, the fluid tank situated with respect to the wafer stage for enabling full immersion of the wafer retained on the wafer stage in the immersion fluid and a cover disposed over at least a portion of the fluid tank for providing a temperature-controlled, fluid-rich environment within the fluid tank.

20 Claims, 14 Drawing Sheets

Related U.S. Application Data continuation of application No. 11/671,046, filed on Feb. 5, 2007, now Pat. No. 8,253,922.

(60) Provisional application No. 60/864,241, filed on Nov. 3, 2006.

(56) References Cited

U.S. PATENT DOCUMENTS

| | | |
|---|---|---|
| 7,075,616 B2 | 7/2006 | Derksen et al. |
| 7,091,502 B2 | 8/2006 | Gau et al. |
| 7,199,858 B2 | 4/2007 | Lof et al. |
| 7,213,963 B2 | 5/2007 | Lof et al. |
| 7,304,715 B2 | 12/2007 | Cadee et al. |
| 7,349,064 B2 | 3/2008 | Nakano |
| 7,379,162 B2 | 5/2008 | Miyajima |
| 7,397,533 B2 | 7/2008 | Verhagen et al. |
| 7,483,119 B2 | 1/2009 | Owa et al. |
| 7,501,226 B2 | 3/2009 | Lin et al. |
| 7,932,991 B2 | 4/2011 | Nagasaka et al. |
| 7,986,395 B2 | 7/2011 | Chang et al. |
| 8,004,650 B2 | 8/2011 | Hirukawa et al. |
| 8,035,797 B2 | 10/2011 | Tani et al. |
| 8,208,116 B2 | 6/2012 | Lin et al. |
| 8,253,922 B2 | 8/2012 | Lin et al. |
| 2004/0075895 A1 | 4/2004 | Lin et al. |
| 2005/0219488 A1 | 10/2005 | Nei et al. |
| 2007/0177125 A1 | 8/2007 | Shibazaki |
| 2008/0304025 A1 | 12/2008 | Chang |

FOREIGN PATENT DOCUMENTS

| | | |
|---|---|---|
| CN | 1746775 | 3/2006 |
| CN | 1501172 | 4/2009 |
| JP | 6124873 | 6/1994 |
| JP | 2005005707 | 6/2005 |
| JP | 20051566776 | 6/2005 |
| JP | 2006165562 | 6/2006 |
| JP | 2006190996 | 7/2006 |
| WO | WO2005/024517 | 3/2005 |

OTHER PUBLICATIONS

Japanese Patent Office, Final Notice of Reasons for Refusal dated Jan. 4, 2011, Application No. 2007-245245. 5 pages.

Japanese Patent Office, Office Action issued Jun. 28, 2010, Application No. 2007-245245. 6 pages.

Chinese Patent Office, Office Action dated Feb. 20, 2009, Application No. 2007101531915, 8 pages.

Chinese Patent Office, Office Action dated Feb. 20, 2009, Application No. 2007101531900, 4 pages.

Dutch Patent Office, Written Opinion and Search Report dated Dec. 2, 2009. Application No. 1034411, 8 pages.

Dutch Patent Office, Written Opinion and Search Report dated Dec. 2, 2009, Application No. 1034412, 7 pages.

IMMERSION LITHOGRAPHY SYSTEM USING A SEALED WAFER BATH

PRIORITY DATA

The present application is a continuation application of U.S. patent application Ser. No. 13/595,734, filed Aug. 27, 2012, which is a continuation of U.S. patent application Ser. No. 11/671,046, filed Feb. 5, 2007, issued as U.S. Pat. No. 8,253,922, which claims priority from U.S. provisional patent application No. 60/864,241, filed on Nov. 3, 2006, each of which is hereby incorporated by reference in its entirety.

BACKGROUND

The present disclosure relates generally to immersion photolithography and, more particularly, to an immersion photolithography system using a sealed wafer bath.

Immersion lithography is a relatively new advancement in photolithography, in which the exposure procedure is performed with a liquid filling the space between the surface of the wafer and the lens. Using immersion photolithography, higher numerical apertures can be built than when using lenses in air, resulting in improved resolution. Further, immersion provides enhanced depth-of-focus (DOF) for printing ever smaller features. It is understood that the present disclosure is not limited to immersion lithography, but immersion lithography provides an example of a semiconductor process that can benefit from the invention described in greater detail below.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to the liquid immersion photolithography systems, and, more particularly, to an immersion photolithography system using a sealed wafer bath. It is understood, however, that specific embodiments are provided as examples to teach the broader inventive concept, and one of ordinary skill in the art can easily apply the teachings of the present disclosure to other methods and systems. Also, it is understood that the methods and systems discussed in the present disclosure include some conventional structures and/or steps. Since these structures and steps are well known in the art, they will only be discussed in a general level of detail. Furthermore, reference numbers are repeated throughout the drawings for the sake of convenience and example, and such repetition does not indicate any required combination of features or steps throughout the drawings.

Generally, there are two system configurations in immersion lithography, including lens-based ("LBC") systems and wafer-based ("WBC") systems. With LBC systems, immersion fluid is selectively applied to and extracted from a small region between the lens and the wafer and the immersion assembly is stationary with respect to the lens as the wafer is stepped or scanned.

Figure 1A:
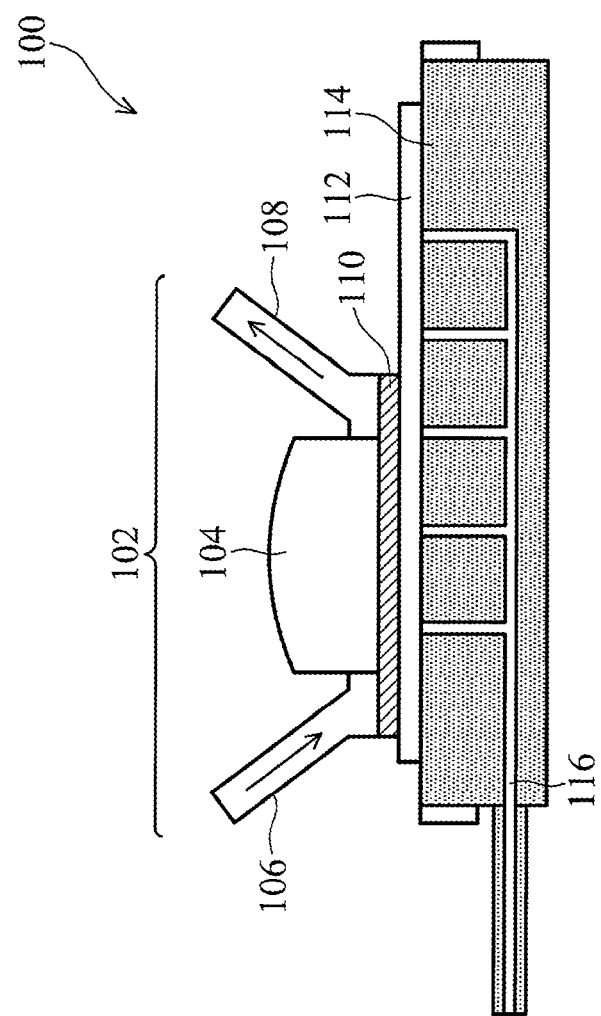
FIG. 1A illustrates an LBC immersion system.

Referring to FIG. 1A, a LBC system 100 includes an immersion head 102 comprising an imaging lens 104, a fluid inlet 106, and a fluid outlet 108. As shown in FIG. 1A, immersion fluid is disposed in an area 110 beneath the imaging lens 104 and above a wafer 112, which is secured to a wafer stage 114 via a vacuum system 116. Through the movement of the wafer stage 114 and the secured wafer 112, the fluid. The fluid is injected into the area 110 via the fluid inlet 106 and expelled via the fluid outlet 108, which process may result in fluid temperature control issues and fluid evaporation problems.

Advantages to LBC systems include the fact that the wafer stage thereof is essentially identical to that of a dry system, thereby saving development time and expense. Additionally, with LBC systems it is possible to maintain the same alignment, focus, and leveling setup as used in dry systems. Finally, with LBC systems, the volume of immersion fluid used is small, so that filling up the fluid-retaining cavity can be performed very quickly, thereby maintaining high wafer throughput volume.

Figure 1B:
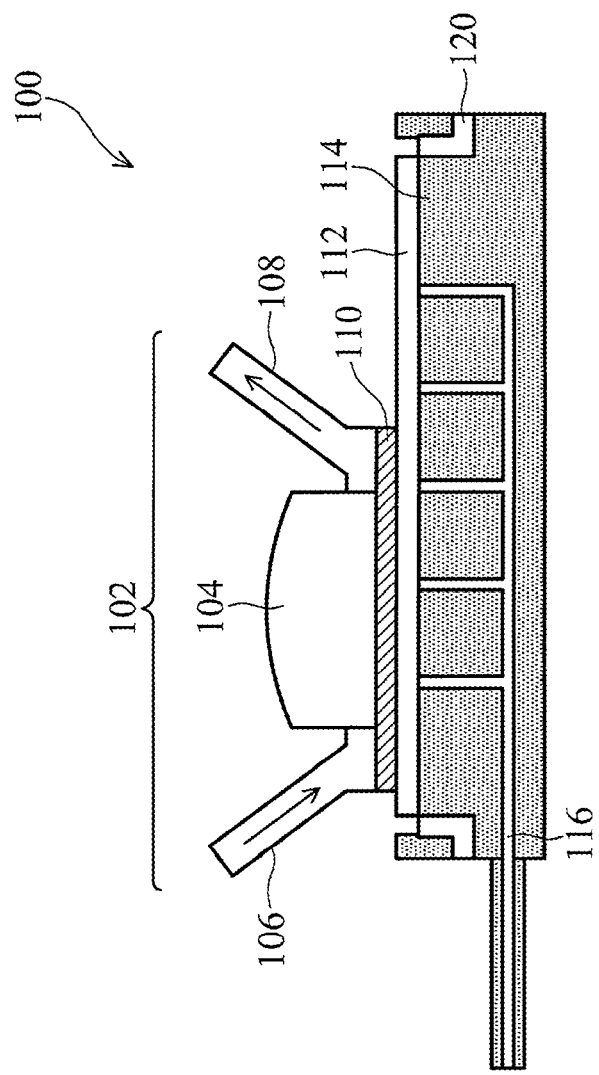
FIG. 1B illustrates an alternative design of an LBC immersion system.

Problems associated with LBC systems include the fact that, near the edge of the wafer, the immersion region includes the wafer and areas outside the chuck, such that maintaining the hydrodynamics in the fluid cavity and managing fluid extracting can be more difficult. Another problem is that particles at the backside of the wafer tend to be washed to the surface. Additionally, the LBC immersion head tends to leave trace amounts of fluid behind on the wafer surface as the wafer moves during the step-and-scan operation. This is a root cause of fluid stains on the wafer. Yet another problem associated with LBC systems is that the photoresist will have inconsistent fluid-contact history at different locations. Specifically, as the wafer is stepped from field to field, the neighboring fields, or parts thereof, are covered by fluid. This may occur to the same field multiple times and not necessarily in the same sequence or the same number of times for each field. Finally, in some LBC system designs, such as illustrated in FIG. 1B, immersion fluid flows over the wafer edge into a fluid drain 120 located along the edge of the wafer 112. While this reduces particle trapping, it results in wafer cooling at the edge, distorting the wafer and affecting overlay accuracy.

Figure 2:
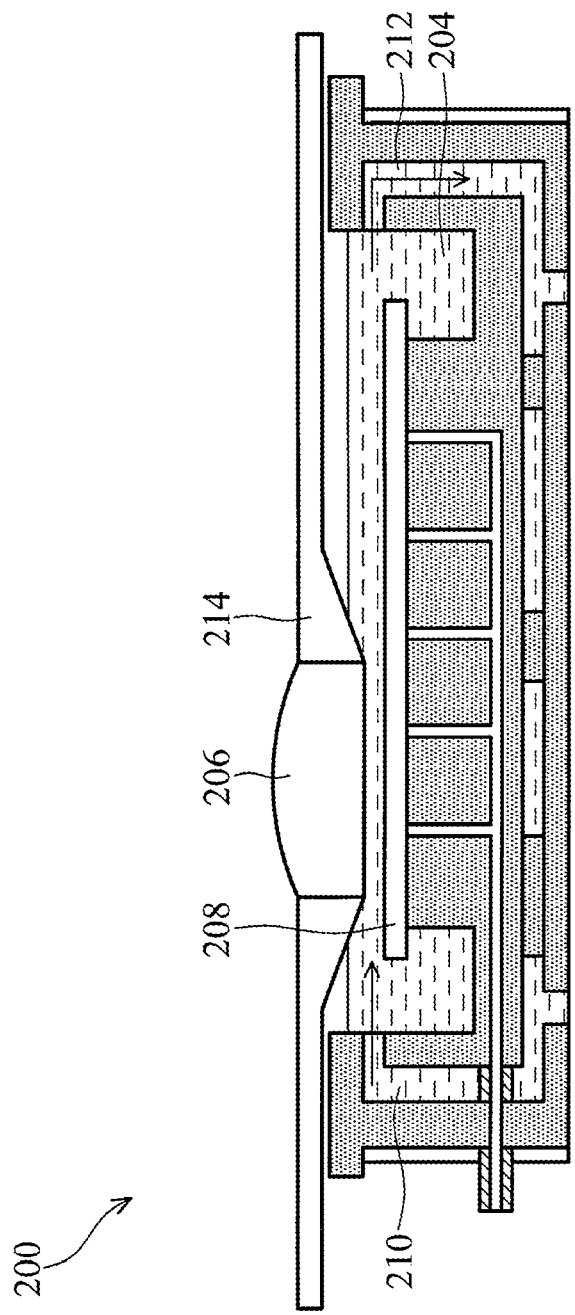
FIG. 2 illustrates a WBC immersion system.

Referring to FIG. 2, in contrast to LBC systems, in WBC systems, the wafer is completely immersed in immersion fluid in a circulating tank in the wafer stage. For example, in a WBC system 200, immersion fluid is selectively introduced into and expelled from a small region 204 between a lens 206 and a wafer 208 via a fluid inlet 210 and a fluid outlet 212. The immersion fluid circulates in the region 204 under and over the wafer stage continuously and is filtered and temperature-regulated as it moves across the surface area of the wafer 208. The fluid can be completely drained from the region 204 to allow for loading and unloading of the wafer 208. A cover 214 prevents immersion fluid 202 from spilling over and foreign particles from falling into the fluid.

Advantages of WBC systems include the fact that exposure at the edge of the wafer is the same as that at the center thereof. Moreover, each field contacts the wafer for the same amount of time. Additionally, there is no possibility of fluid stains caused by an immersion head and there is no issue of bubble generation from poor hydrodynamics near the edge of the wafer. WBC systems do, however, suffer certain deficiencies, including the fact that pre- and post-exposure soaking times of each exposure field are different. Moreover, it takes more effort or more time to fill and drain the immersion fluid and focusing, tilting, and alignment have to be performed in the immersion mode if twin stage is not used. Finally, substantial redesign of the wafer stage, as compared to a dry system, is necessary.

Two additional problems affect both LBC and WBC systems. These include the fact that the resist at the wafer edge within several millimeters (the "edge bead"), is usually removed because it is thicker than the rest of the resist coating. This leaves the possibility of broken resist fragments under the flushing of the fluid, thus contributing to particulate defects. Moreover, the fluid can seep into the underside of the wafer, making it a contamination source and susceptible for contamination as well. The evaporation of this fluid can contribute to uneven cooling and overlay errors.

Figure 3:
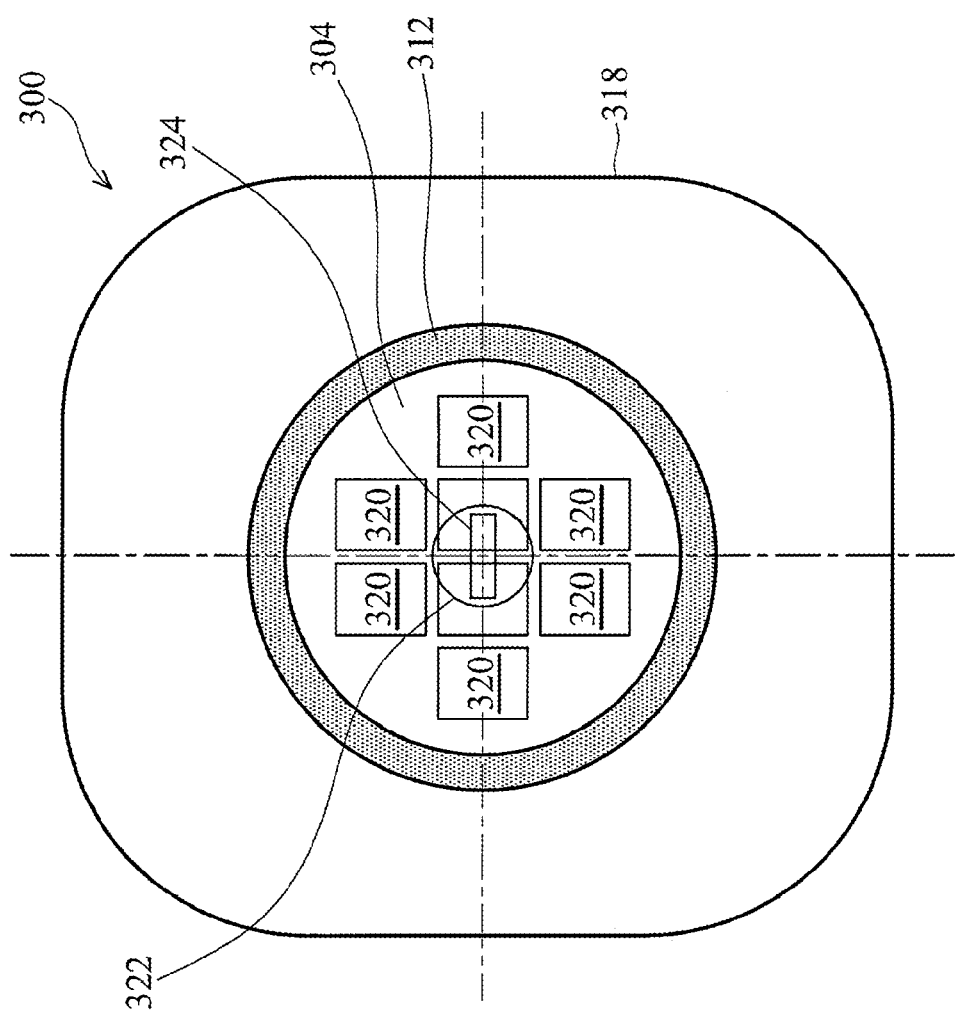
FIG. 3 illustrates a top view of a full immersion lithography system using a sealed wafer bath in accordance with one embodiment.
Figure 4:
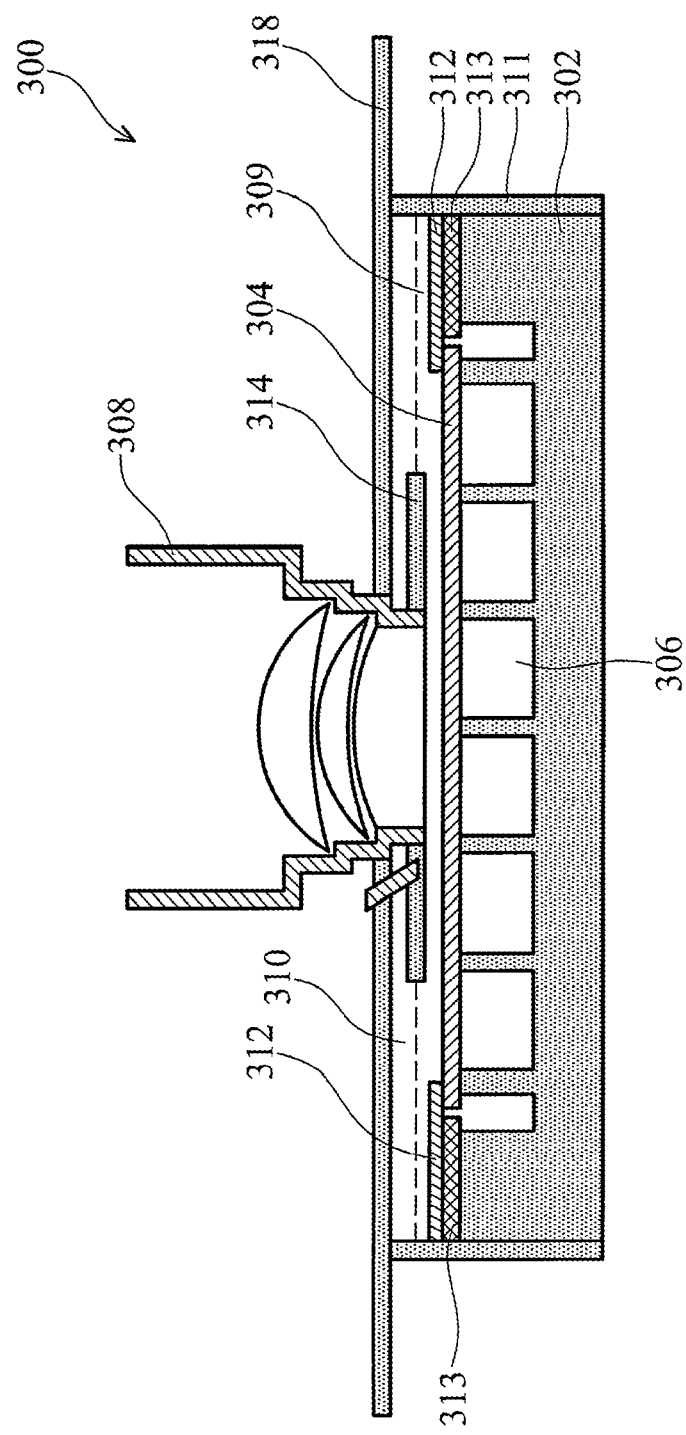
FIG. 4 illustrates a side view of the full immersion lithography system of FIG. 3.

Referring now to FIGS. 3 and 4, illustrated therein are top and side views of a full immersion lithography system 300 comprising a sealed bath in accordance with one embodiment. As best shown in FIG. 4, the system 300 comprises a wafer stage 302 to which a wafer 304 may be secured via a vacuum system 306. A lens assembly 308 is disposed over the wafer 304 and wafer stage 302. In accordance with one embodiment, immersion fluid 309 is disposed in an area, or tank, 310 over and around the wafer 304 between the wafer and the front surface of the lens assembly 308. The immersion fluid is retained within the tank 310 by a fluid retaining wall 311. In one embodiment, a refractive index of the immersion fluid is substantially 1.34. A seal ring 312 constructed of a thin flexible material such as Mylar, Teflon, rubber, etc. with thickness between a few micrometers and a few hundreds of micrometer is disposed on the wafer stage 302 via a seal ring frame 313 such that it contacts a top edge of the wafer 304 disposed on the stage. Suction created by the vacuum system 306 in a gap between the outer edge of the wafer 304 and the inner side of the seal ring frame 313 tightens the seal of the seal ring 312 to prevent leakage of immersion fluid 309 into the gap. The wafer 304 is moved under the lens assembly 308 for stepping and scanning.

A proximity cover 314 contacts the immersion fluid 309 in the area surrounding the lens assembly 308. The proximity cover 314 should be as large as possible; however, its size is limited by the existence of the fluid retaining wall 311 surrounding the tank 310. An enclosing cover 318 is attached to a lens column of the lens assembly 308 to enclose the tank 310 and create and maintain a fluid-vapor-rich environment therein. The enclosing cover 318 is larger than the fluid retaining wall 311, such that the area above the immersion fluid 309 is always enclosed at any wafer position.

Figure 5:
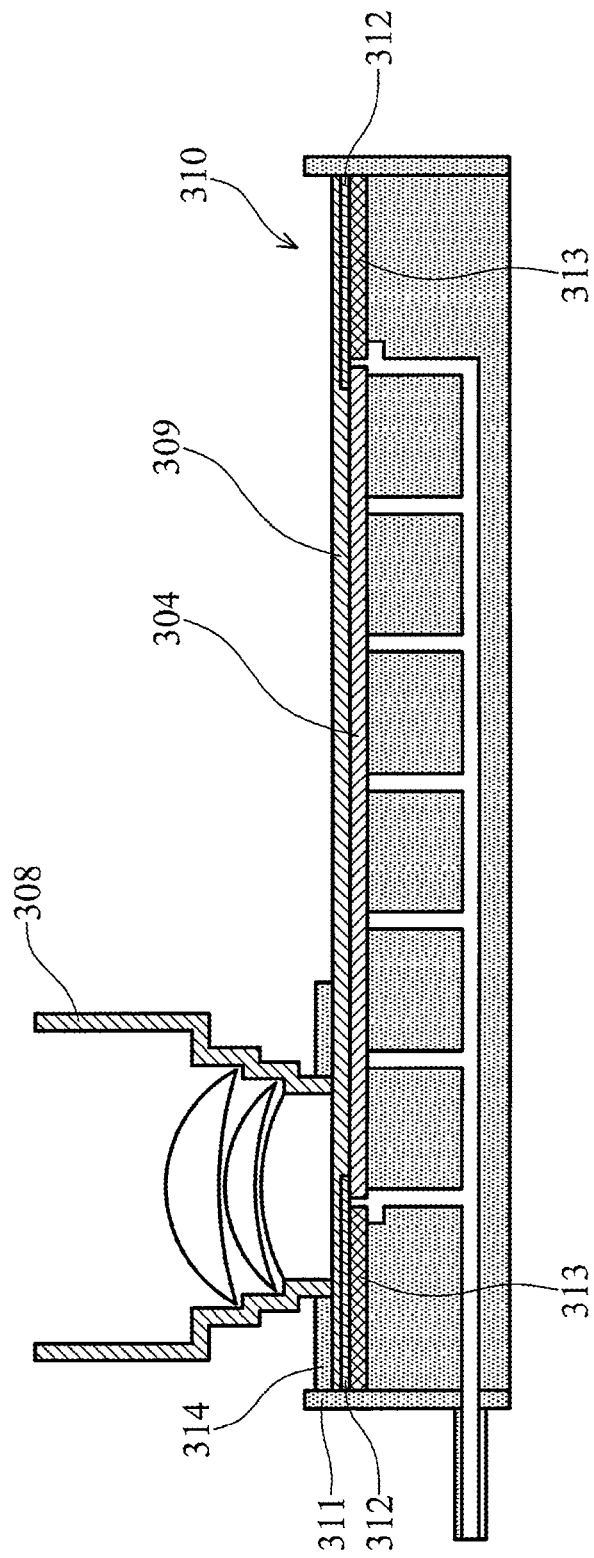
FIG. 5 is an enlarged side view of the full immersion lithography system of FIG. 3 showing a proximity cover thereof.
Figure 6:
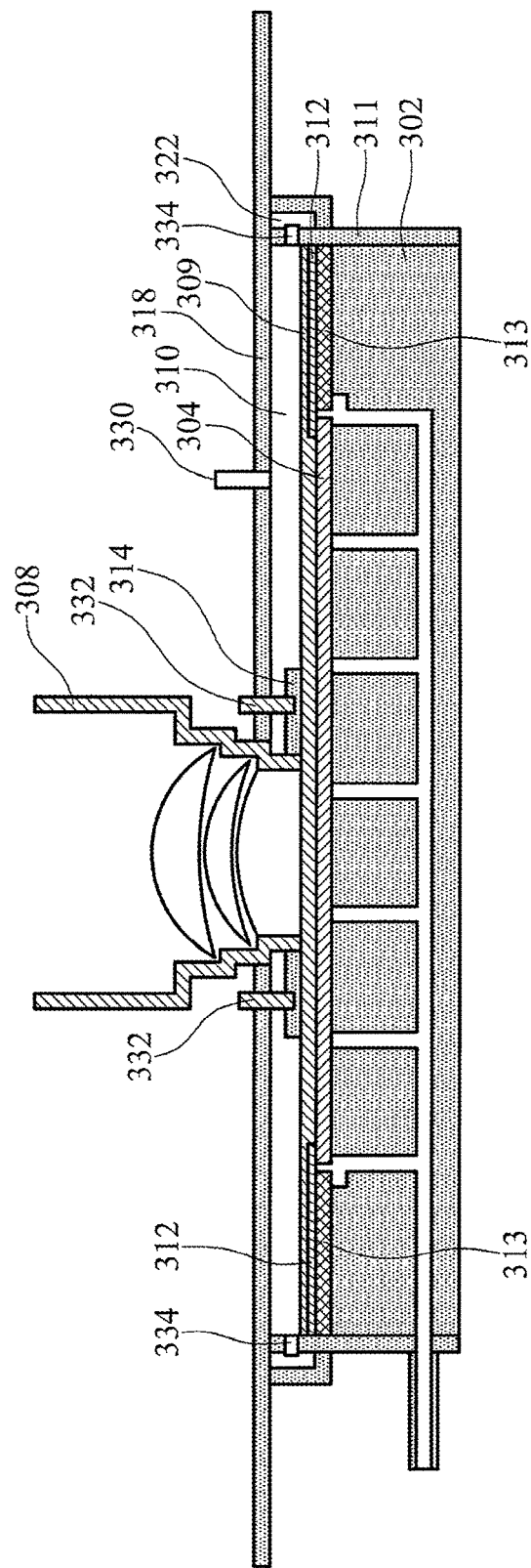
FIG. 6 illustrates the full immersion lithography system of FIG. 3 showing an enclosing cover thereof.

FIG. 3 best illustrates the relationship between the seal ring 312, the wafer 304, and the enclosing cover 318. As shown in FIG. 3, the wafer 304 comprises a plurality of scanned fields 320. A region 322 represents a lens field of the lens assembly 308. A slot 324 is also provided. The scan field is restricted to the area of slot 324. It will be recognized that the size of the proximity cover 314 should allow for the lens assembly 308, and particularly the lens slot 324 to be positioned as close as necessary to the edge of the wafer 304, as restricted by the existence of the fluid retaining wall 311. FIG. 5 illustrates positioning of the lens assembly 308 with the proximity cover 314 proximate an edge of the wafer 304. The enclosing cover 318 is provided for preventing evaporation of the immersion fluid 309. As best illustrated in FIG. 6, the enclosing cover 318 slows the escape of fluid vapor to reduce cooling due to fluid evaporation. A fluid-vapor-rich environment is provided to prevent fluid evaporation. Saturated vapor can be introduced into the area 310 enclosed by the enclosing cover 318, the wafer stage 302, and the fluid retaining walls 311, preferably through a fluid vapor inlet 330 through the enclosing cover 318. Similarly, fluid is introduced to the area 310 via one or more fluid inlets 332. Overflow fluid flows out of the area 310 into a trench 334 surrounding the fluid retaining wall 311 via fluid overflow holes 336 disposed in the wall. The fluid collected in the trench 334 can be properly drained therefrom via any number of draining systems (not shown).

Figure 7:
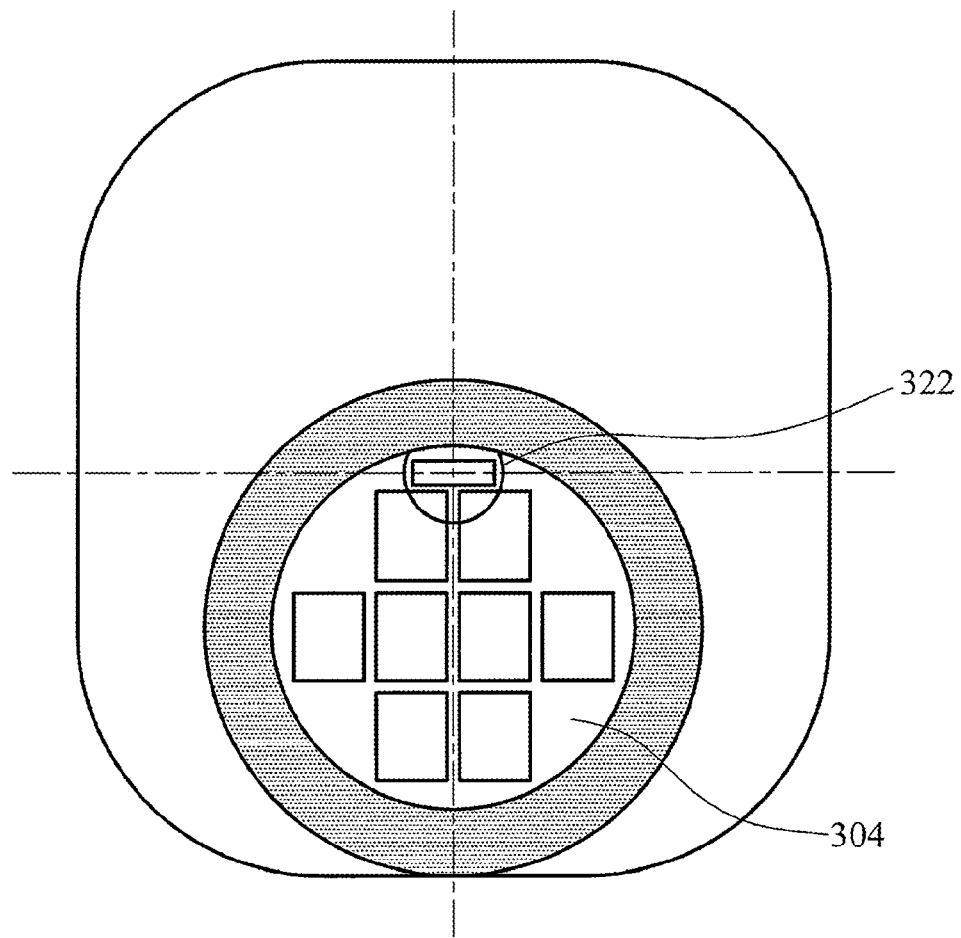
FIG. 7 illustrates a wafer at a position in which the lens field is disposed at the extreme topmost exposure position on the wafer.
Figure 8:
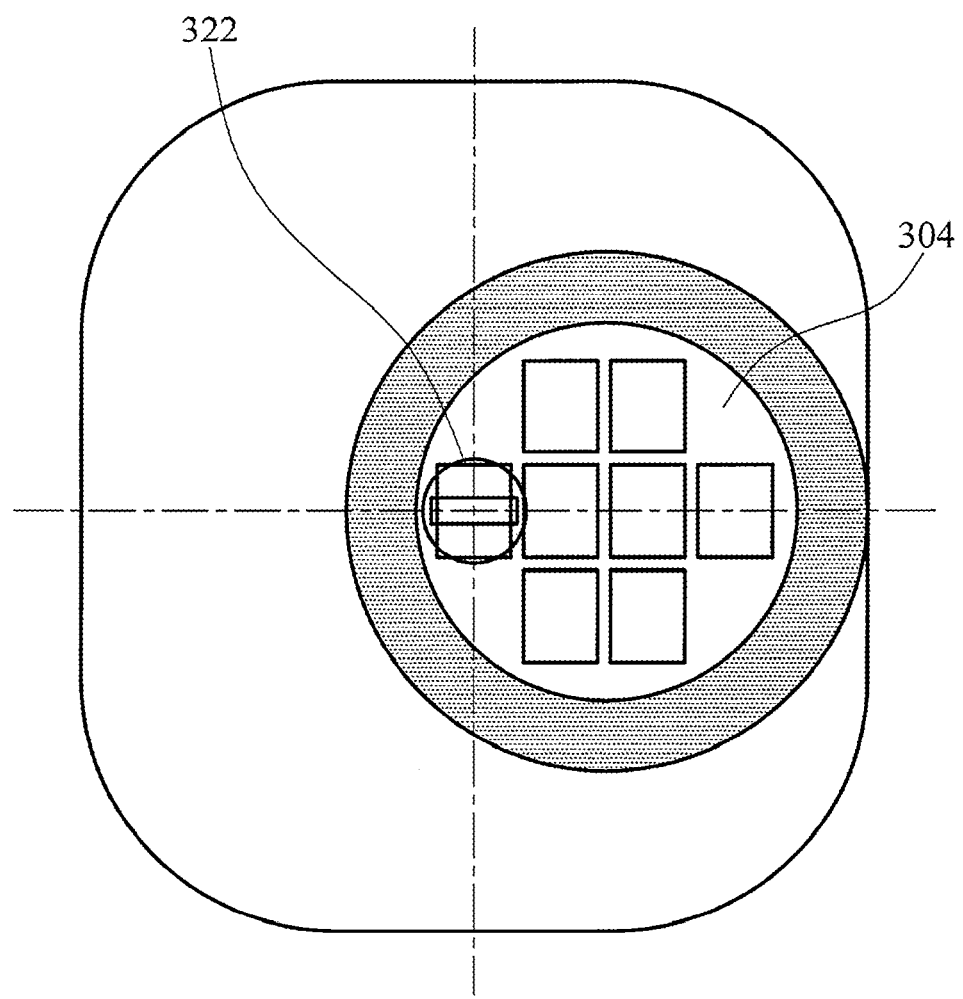
FIG. 8 illustrates a wafer at a position in which the lens field is disposed at the extreme leftmost exposure position on the wafer.

FIG. 7 illustrates the wafer 304 at a position in which the lens field 322 is disposed at the extreme topmost exposure position on the wafer. FIG. 8 illustrates the wafer at a position in which the lens field 322 is disposed at the extreme leftmost exposure position on the wafer.

Figure 9:
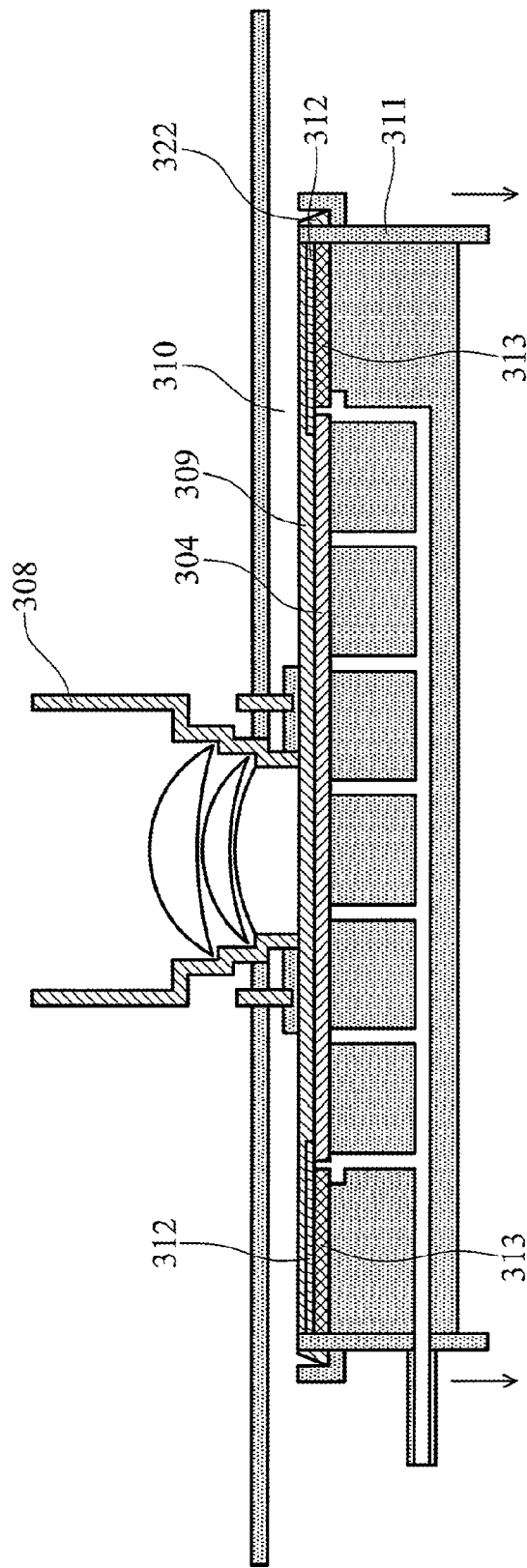
FIG. 9 illustrates the full immersion lithography system of FIG. 3 after the retaining wall thereof has been lowered to drain the immersion fluid therefrom.

In one embodiment, a loading sequence comprises raising the seal ring 312 and seal ring frame 313 using a vertically movable mechanism, after which the wafer 304 is lowered onto the wafer stage 302. In one embodiment, this may be accomplished by placing the wafer 304 onto three supporting pins surrounding the lens axis with a wafer-moving arm, which pins are lowered to drop the wafer onto the wafer stage. The seal ring assembly comprising the seal ring frame 313 and seal ring 312 is then lowered to seal the edge of the wafer 304. The wafer stage 302 is then moved to beneath the lens assembly 308, at which point the immersion fluid 309 and fluid vapor can be input into the tank 310. In one embodiment, vapor filling takes place first until complete saturation is achieved. The temperature of the fluid vapor, as well as that of the immersion fluid 309, should be regulated. The fluid vapor can be continuously fed to compensate for vapor loss through incomplete sealing of the area 310. In particular, a gap is intentionally left between the bottom of enclosing cover 318 and the top edge of the fluid retaining wall 311 so that there is not friction as the wafer stage 302 moves with respect to the enclosing cover. Once the wafer 304 has been completely exposed, the fluid retaining wall 311 is lowered, as shown in FIG. 9, to allow the immersion fluid to flow out into the trench 332. A fluid drain (not shown) may also be provided for draining fluid from the area 310. Residual fluid can be dried with an air jet or air knife after the wafer 304 is moved away from beneath the lens assembly 308 to a wafer load/unload position or a wafer measurement position as in a twin-wafer-chuck scanner.

Figure 10:
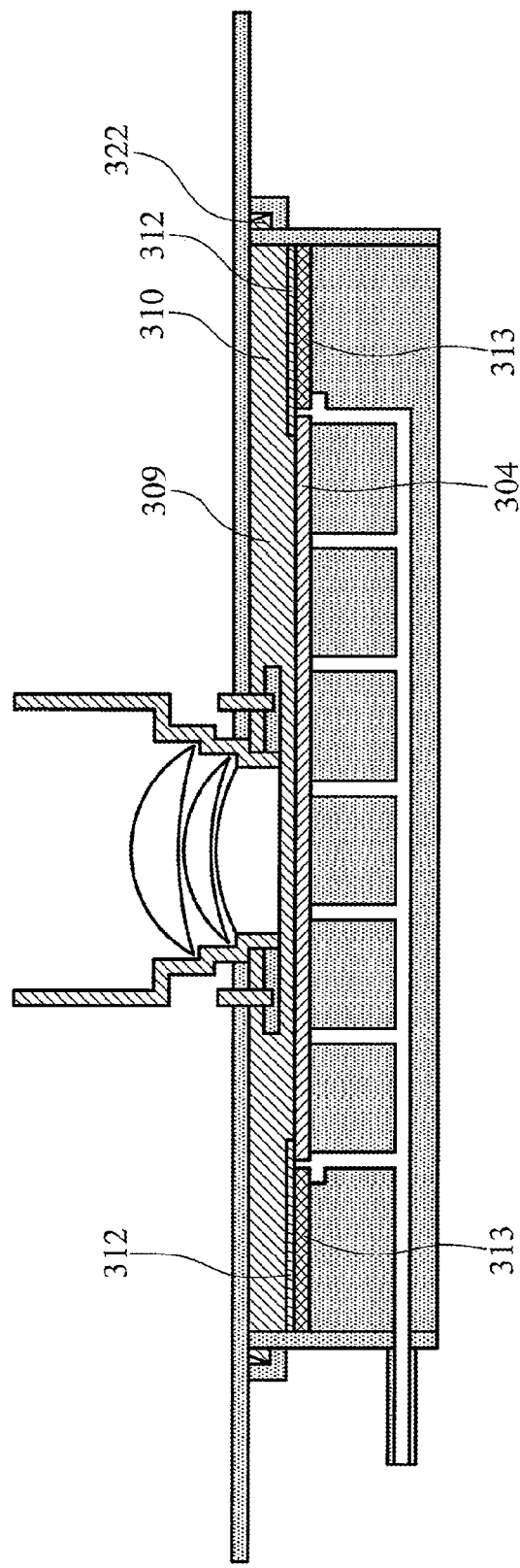
FIG. 10 illustrates an alternative arrangement of the full immersion lithography system of FIG. 3.

Alternately the entirety of the area 310 can be filled with immersion fluid can be filled with immersion fluid 309, as illustrated in FIG. 10. In this manner, there is no need to use saturated vapor to prevent fluid evaporation; however, the fluid must still be carefully temperature controlled. After the wafer 304 is exposed, the fluid can be removed from the tank 310 as described above with reference to FIG. 9.

Figure 11:
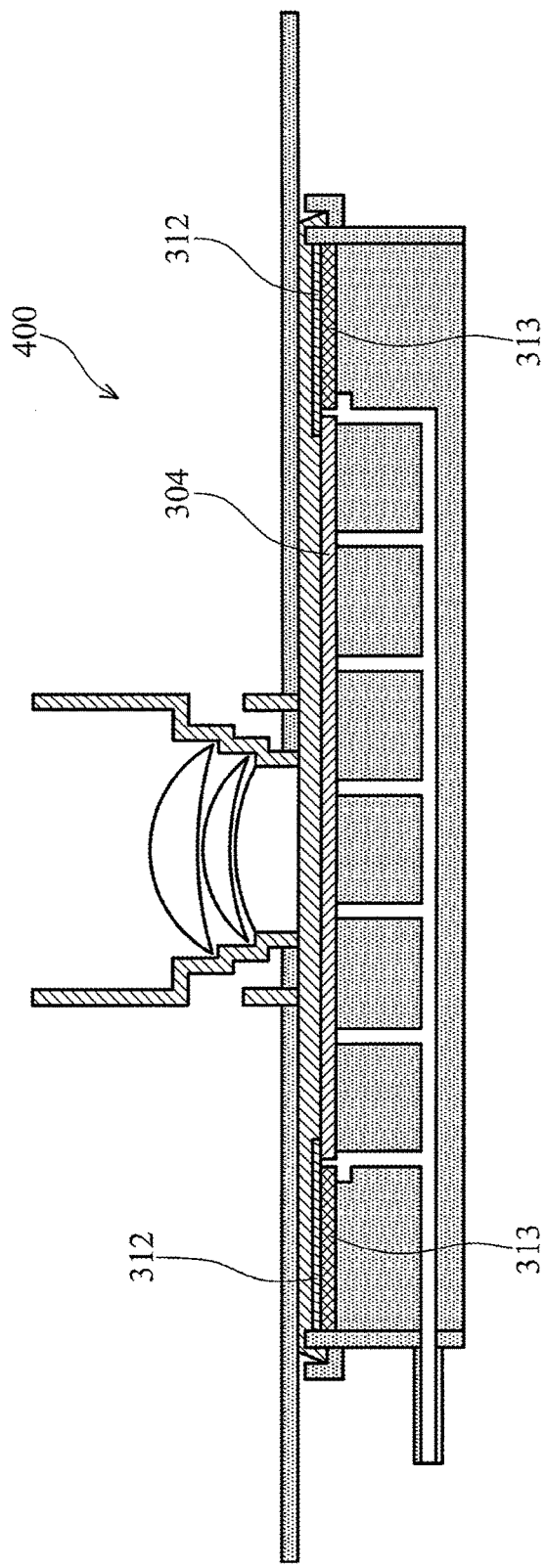
FIG. 11 illustrates a full immersion lithography system in accordance with another alternative embodiment.

FIG. 11 illustrates a full immersion lithography system 400 that differs from the system 300 in that it does not include a proximity cover. There is no need to induce a fluid-vapor-rich environment above the fluid in the system 400.

Figure 12:
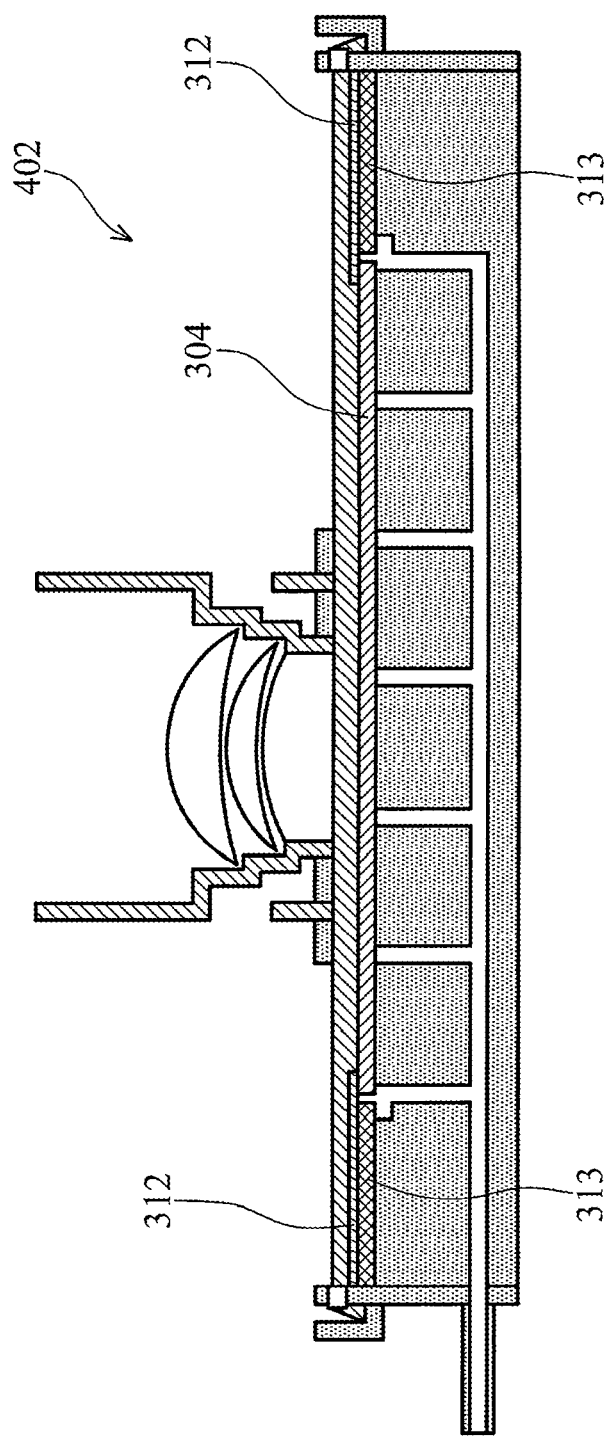
FIG. 12 illustrates a full immersion lithography system in accordance with yet another alternative embodiment.

FIG. 12 illustrates a full immersion lithography system 402 that differs from the system 300 in that it does not include an enclosing cover. The system 402 may be used so long as the stability and homogenity of the refractive index of the fluid within the proximity cover is acceptable.

Figure 13:
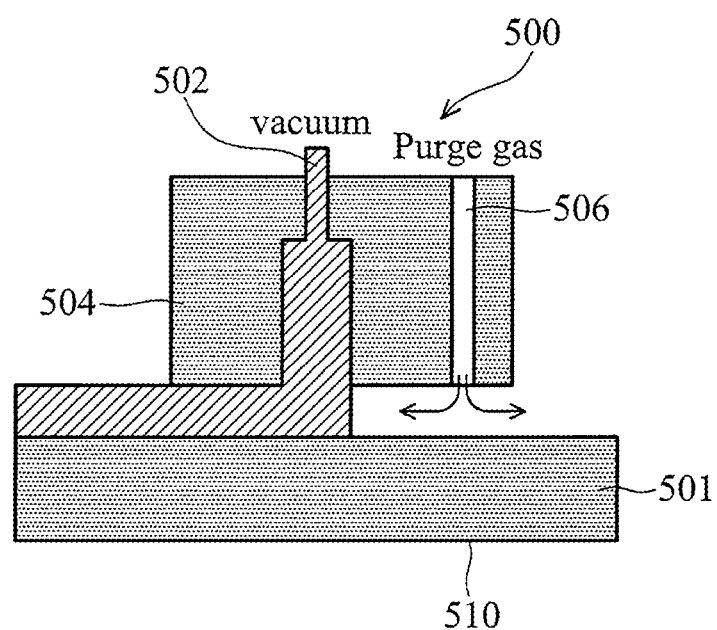
FIG. 13 illustrates a drying head for use in removing residual fluid from a wafer following exposure using a full immersion lithography process of one embodiment.

FIG. 13 illustrates a drying head 500 for use in removing residual fluid from a wafer 501 following exposure using a full immersion lithography process of one embodiment. As shown in FIG. 13, the drying head 500 includes at least one fluid vacuum outlet 502 for draining immersion fluid in a direction indicated by an arrow 504. Additionally, the head 500 includes a purge gas inlet 506 for introducing purge gas onto the surface of the wafer 501 as the wafer is moved underneath the head 500 in a direction indicated by an arrow 510. The combination of the removal of immersion fluid via the fluid vacuum outlet 502 and introduction of purge gas via the purge gas inlet 506 for drying the wafer 501 is highly effective in removing residual fluid therefrom.

As a result of the embodiments described herein, because the wafer is constantly under the immersion fluid until the exposure is complete, water stain is avoided. Moreover, the prevention of fluid evaporation ensures homogeneity to prevent water distortion affecting overlay accuracy. Finally, the seal ring reduces particles and prevents turbulence-induced bubbles. It also covers the wafer edge bead to prevent particle generation.

Although only a few exemplary embodiments of this invention have been described in detail above, those skilled in the art will readily appreciate that many modifications are possible in the exemplary embodiments without materially departing from the novel teachings and advantages of this invention.

It is understood that various different combinations of the above-listed embodiments and steps can be used in various sequences or in parallel, and there is no particular step that is critical or required. Furthermore, features illustrated and discussed above with respect to some embodiments can be combined with features illustrated and discussed above with respect to other embodiments. Accordingly, all such modifications are intended to be included within the scope of this invention.

What is claimed is:

1. An apparatus comprising:
an imaging lens;
a wafer stage for supporting a wafer beneath the imaging lens;
a fluid tank having a wall for retaining fluid, the fluid tank positioned with respect to the wafer stage for enabling the fluid to be positioned on the wafer; and
a trench disposed around the fluid tank, wherein the wall of the fluid tank is configured so that it may be moved with respect to the fluid tank to allow the fluid to flow out of the fluid tank and into the trench.

2. The apparatus of claim 1, further comprising a cover disposed over the fluid tank, wherein the cover includes a portion directly over the wall of the fluid tank, wherein the wall of the fluid tank is configured so that it may be moved with respect to the cover to create a gap between the wall of the fluid tank and the portion of the cover directly over the wall of the fluid tank.

3. The apparatus of claim 1, further comprising a seal ring disposed around the wafer.

4. The apparatus of claim 1, wherein the fluid is positioned directly on the wafer and directly on the seal ring.

5. The apparatus of claim 1, wherein the imaging lens is part of a lens assembly having a cover disposed over the wafer, wherein a portion of the cover physically contacts the fluid.

6. The apparatus of claim 1, further comprising a cover disposed over the fluid tank, wherein the fluid disposed within fluid the fluid tank extends continuously from the wafer to the cover.

7. The apparatus of claim 1, further comprising a cover disposed over the fluid tank, wherein the fluid disposed within fluid the fluid tank does not extend from the wafer to the cover.

8. An apparatus comprising:
a wafer stage for supporting a wafer;
a fluid tank having a wall for retaining fluid, the fluid tank positioned with respect to the wafer stage for enabling the fluid to be positioned on the wafer; and
a trench disposed around the fluid tank, wherein the wall of the fluid tank is configured so that it may be moved with respect to the fluid tank to allow the fluid to flow out of the fluid tank and into the trench.

9. The apparatus of claim 8, further comprising a lens assembly disposed over the wafer stage.

10. The apparatus of claim 9, wherein the lens assembly includes a first cover disposed over the fluid tank that assists in maintaining a temperature within the fluid tank, and
wherein the lens assembly further includes a second cover disposed within the fluid tank directly over the wafer and physically contacting the fluid.

11. The apparatus of claim 8, further comprising a seal ring disposed directly on a portion of the wafer, wherein the seal ring includes a portion physically contacting the wall of the fluid tank.

12. The apparatus of claim 9, where the wall of the fluid tanks has an opening that extends completely through the wall of the fluid.

13. The apparatus of claim 9, further comprising a cover disposed over the fluid tank, wherein the cover includes a portion directly over the wall of the fluid tank, wherein the wall of the fluid tank is configured so that it may be moved with respect to the cover to create a gap between the wall of the fluid tank and the portion of the cover directly over the wall of the fluid tank.

14. The apparatus of claim 8, wherein the fluid includes an immersion fluid.

15. A method comprising
loading a wafer onto a wafer stage disposed beneath an imaging lens;
providing a fluid tank with fluid over the wafer; and moving a wall of the fluid tank with respect to the fluid tank to allow the fluid to flow out of the fluid tank and into a trench disposed around the fluid tank.

16. The method of claim 15, wherein providing the fluid tank with fluid over the wafer includes providing the fluid tank with the fluid such that the wafer is immersed within the fluid.

17. The method of claim 15, further comprising exposing a portion of the wafer, and
wherein moving the wall of the fluid tank with respect to the fluid tank to allow the immersion fluid to flow out of the fluid tank and into the trench occurs after exposing the portion of the wafer.

18. The method of claim 15, further comprising:
positioning a seal ring over the wafer; and
positioning a cover over the fluid tank; and
exposing a portion of the wafer while the seal ring is positioned over the wafer and the cover is positioned over the fluid tank, wherein the fluid extends from the cover to the wafer during the exposing of the portion of the wafer.

19. The method of claim 15, further comprising:
positioning a cover over the fluid tank; and
delivering fluid into the fluid tank via an inlet extending through the cover.

20. The method of claim 15, further comprising positioning a cover over the fluid tank, wherein a portion of the cover is positioned directly over the wall of the fluid tank, and
wherein moving the wall of the fluid tank with respect to the fluid tank to allow the fluid to flow out of the fluid tank and into the trench disposed around the fluid tank includes moving the wall of the fluid tank with respect to the cover such that a gap is created between the wall of the fluid tank and the portion of the cover.

* * * * *